United States Patent
Yamamoto et al.

(10) Patent No.: US 7,914,641 B2
(45) Date of Patent: Mar. 29, 2011

(54) SEALING MATERIAL FOR FLAT PANEL DISPLAY

(75) Inventors: Yugo Yamamoto, Chiba (JP); Yuichi Ito, Ichihara (JP)

(73) Assignee: Mitsui Chemicals, Inc., Minato-Ku, Tokyo (JP)

( * ) Notice: Subject to any disclaimer, the term of this patent is extended or adjusted under 35 U.S.C. 154(b) by 320 days.

(21) Appl. No.: 12/089,152

(22) PCT Filed: Oct. 2, 2006

(86) PCT No.: PCT/JP2006/319733
§ 371 (c)(1),
(2), (4) Date: Apr. 3, 2008

(87) PCT Pub. No.: WO2007/040209
PCT Pub. Date: Apr. 12, 2007

(65) Prior Publication Data
US 2010/0152315 A1    Jun. 17, 2010

(30) Foreign Application Priority Data
Oct. 3, 2005   (JP) ................. 2005-289855

(51) Int. Cl.
*B29C 65/00* (2006.01)
*C09J 163/00* (2006.01)
*C09K 3/10* (2006.01)

(52) U.S. Cl. .............. 156/275.7; 156/275.5; 156/330; 428/1.53; 522/65; 522/170

(58) Field of Classification Search .......... 428/1.53; 156/275.5, 330, 275.7; 522/65, 170
See application file for complete search history.

(56) References Cited

U.S. PATENT DOCUMENTS

| | | | |
|---|---|---|---|
| 6,057,380 A * | 5/2000 | Birbaum et al. | 522/8 |
| 6,586,496 B1 * | 7/2003 | Takamatsu et al. | 522/168 |
| 7,495,035 B2 * | 2/2009 | Yamamoto et al. | 522/181 |
| 2003/0062125 A1 | 4/2003 | Takamatsu et al. | |
| 2005/0126697 A1 * | 6/2005 | Kuczynski | 156/275.7 |
| 2006/0229376 A1 * | 10/2006 | Hayashi et al. | 522/6 |
| 2008/0161471 A1 * | 7/2008 | Yamamoto et al. | 524/437 |

FOREIGN PATENT DOCUMENTS

| | | |
|---|---|---|
| CN | 1282105 A | 1/2001 |
| JP | 2000-330270 A | 11/2000 |
| JP | 2002-201264 A | 7/2002 |
| JP | 2003-096184 A | 4/2003 |
| JP | 2003-277712 A | 10/2003 |
| JP | 2004-027001 A | 1/2004 |
| JP | 2005-232369 A | 9/2005 |

OTHER PUBLICATIONS

Form PC/ISA/210 (International Search Report) dated Jan. 9, 2007.

* cited by examiner

*Primary Examiner* — Susan W Berman
(74) *Attorney, Agent, or Firm* — Buchanan Ingersoll & Rooney PC

(57) ABSTRACT

A sealing material for a flat panel display contains 100 parts by weight of a compound (A) containing at least one epoxy group in the molecule, and 0.01 to 40 parts by weight of a compound (B) that generates a base upon irradiation. The compound (B) that generates a base upon irradiation is preferably a compound that generates a tertiary amine upon irradiation. The sealing material has favorable curability at low temperature, and a long pot life at room temperature, and does not cause deterioration of display members with ionic components and acids.

9 Claims, No Drawings

SEALING MATERIAL FOR FLAT PANEL DISPLAY

TECHNICAL FIELD

The present invention relates to sealing material for a flat panel display that is curable at low temperature, has a long pot life at room temperature, and that does not have a risk of deteriorating display members with ionic components or acids.

BACKGROUND ART

In recent years, flat panel displays have been developed and manufactured using various types of display elements in the electronic and electric industries. Many of these displays have display elements which are sealed in cells made of plastic, glass or the like. Representative displays include liquid crystal (LC) displays and electroluminescent (EL) displays and the like. Generally, the sealing materials for a flat panel display include thermosetting type sealing materials that are curable at a temperature below the heat resistance temperature of the members used and photocurable sealing materials that are curable at room temperature. Generally, the thermosetting sealing material that is used as the sealing material in the liquid crystal display has a curing temperature of approximately 120 to 150° C.

On the other hand, sealing materials for an organic EL display should be curable, at a lower temperature because heat resistance temperatures of organic EL elements for example are 80 to 120° C. However, sealing materials designed to cure at lower temperatures have a shorter pot life at room temperature, and therefore have inferior workability.

Therefore, if curability is required at low temperatures, a sealing material based on an epoxy resin that is cured with UV cationic curing is used (Patent document 2).
Patent Document 1: Japanese Unexamined Patent Laid-Open publication 2004-27001
Patent Document 2: Japanese Unexamined Patent Laid-Open publication 2002-201264

DISCLOSURE OF THE INVENTION

However, when a flat panel display includes members that contact the sealing material and are deteriorated by ionic components or acids, the aforementioned UV cationic curing sealing material can not be used.

Therefore, demand is increasing for a sealing material which has favorable curability at low temperatures, and a long pot life at room temperature, and which does not have a risk of deteriorating display members with ionic components and acids.

Therefore, an object of the present invention is to provide a sealing material for a flat panel display that is curable at low temperature, has a long pot life at room temperature, and that does not have a risk of deteriorating display members with ionic components or acids.

As a result of diligent research to resolve the aforementioned problems, the present inventors have discovered a sealing material for a flat panel display comprising:
100 parts by weight of a compound (A) having at least one epoxy group in the molecule; and
0.01 to 40 parts by weight of a compound (B) that generates a base upon irradiation.
(Herein, beams irradiated include an ultraviolet, electromagnetic waves such as visible light, or a particle beam, and the ultraviolet or the visible light is preferable, and the ultraviolet is more preferable.)

Furthermore, the compound (B) that generates a base upon irradiation is preferably a compound that generates a tertiary amine upon irradiation.

Furthermore, the sealing material may further contain 0.8 to 1.2 equivalents of an acid anhydride (C) as a curing agent based on 1 equivalent of the aforementioned component (A).

Furthermore, the sealing material may further contain a silane coupling agent (D), and an inorganic fine particle filler (E). In other words, the sealing material may contain 0 to 30 parts by weight of the silane coupling agent (D) based on 100 parts by weight of the component (A). Furthermore, the sealing material may contain 0 to 1000 parts by weight of the inorganic fine particle filler (E) based on 100 parts by weight of the component (A).

Furthermore, the present invention relates to a sealing method using the sealing material, and a flat panel display obtained using the sealing material. In other words, the sealing method for a flat panel display of the present invention comprises a step of sealing a flat panel display using the aforementioned sealing material for a flat panel display. Furthermore, the flat panel display of the present invention is obtained by the aforementioned sealing method. Herein, the flat panel displays include a liquid crystal (LC) display, and electroluminescence (EL) display, a plasma display, and the like.

The sealing material for a flat panel display according to the present invention can be cured at low temperature, has a long pot life at room temperature, and does not have a risk of deteriorating display members with ionic components or acids.

BEST MODE FOR CARRYING OUT THE INVENTION

The present invention will be described below in detail.

The sealing material for a flat panel display of the present invention comprises a compound (A) containing at least one epoxy group in the molecule, and a compound (B) that generates a base upon irradiation. Furthermore, an acid anhydride (C) as a curing agent is preferably included. Furthermore, the sealing material for a flat panel display of the present invention preferably contains a silane coupling agent (D) and/or an inorganic fine particle filler (E), in addition to the components (A) to (C).

Compound (A) containing at least 1 epoxy group in the molecule

The compound (A) containing at least 1 epoxy group in the molecule used for the present invention is a compound which contains at least one epoxy group in each molecule as a functional group. Note that the compound (A) containing at least 1 epoxy group in the molecule is referred to as the component (A).

Specific examples of the components (A) include the following materials: monofunctional epoxy compounds such as phenyl glycidyl ether, 2-ethylhexyl glycidyl ether, ethyl diethylene glycol glycidyl ether, dicyclopentadiene glycidyl ether, 2-hydroxyethyl glycidyl ether, bifunctional epoxy compounds such as hydroxynone diglycidyl ether, resorcin diglycidyl ether, ethylene glycol diglycidyl ether, polyethylene glycol diglycidyl ether, 1,4-butandiol diglycidyl ether, 1,6-hexandiol diglycidyl ether, cyclohexanediol diglycidyl ether, cyclohexanedimethanol diglycidyl ether, dicyclopentadienediol diglycidyl ether, 1,6-naphthalenediol diglycidyl ether, bisphenol A diglycidyl ether, bisphenol F diglycidyl ether, hydrogenated bisphenol A diglycidyl ether, and hydrogenated bisphenol F diglycidyl ether, and polyfunctional epoxy compounds such as trimethylolpropane triglycidyl ether, pentaerythritol tetraglycidyl ether, phenol Novolac type epoxy, creosol Novolac epoxy, and epoxylated polybutadiene and the like.

Furthermore, the components (A) may include compounds having at least one cyclic epoxy group in the molecule. Specific examples include compounds shown by the following formulae [1], [2], [3], and [4].

Formula 1

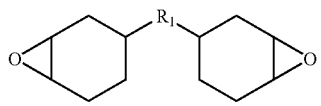

In Formula [1], $R_1$ represents an oxygen atom, a sulfur atom, a linear or branched alkylene group of 1 to 20 carbon atoms such as methylene group, ethylene group, propylene group, or butylene group, a linear or branched poly(alkyeneoxy) group of 1 to 120 carbon atoms such as a poly(ethyleneoxy) group, or a poly(propyleneoxy) group, a linear or branched unsaturated hydrocarbon group such as a propenylene group, methylpropenylene group, or butenylene group, a carbonyl group, alkylene groups containing a carbonyl group, and alkylene groups containing a carbamoyl group in the molecular chain.

Formula 2

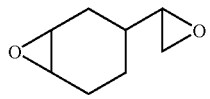

Formula 3

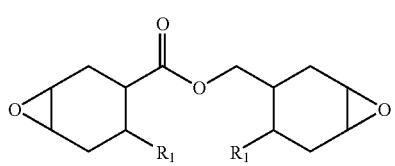

In Formula [3], $R_1$ represents a hydrogen atom, a fluorine atom, an alkyl group of 1 to 6 carbon atoms such as methyl group, ethyl group, propyl group, butyl group, pentyl group, or hexyl group, a fluoroalkyl group of 1 to 6 carbons such as a trifluoromethyl group, perfluoromethyl group, perfluoroethyl group, or perfluoropropyl group, an aryl group of 6 to 18 carbon atoms such as phenyl group, or naphthyl group, a furyl group, and a thienyl group. Both $R_1$ may be the same or may be different groups.

Formula 4

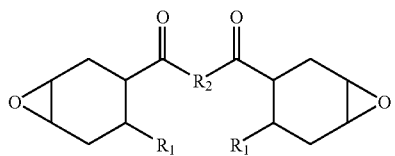

In Formula [4], $R_1$ represents a hydrogen atom, a fluorine atom, an alkyl group of 1 to 6 carbon atoms such as methyl group, ethyl group, propyl group, butyl group, pentyl group, or hexyl group, a fluoroalkyl group of 1 to 6 carbons such as a trifluoromethyl group, perfluoromethyl group, perfluoroethyl group, or perfluoropropyl group, an aryl group of 6 to 18 carbon atoms such as a phenyl group, or naphthyl group, a furyl group, and a thienyl group. Both $R_1$ may be the same or may be different groups. $R_2$ represents an oxygen atom, a sulfur atom, a linear or branched alkylene group of 1 to 20 carbon atoms such as methylene group, ethylene group, propylene group, or butylene group, a linear or branched poly(alkyeneoxy) group of 1 to 120 carbon atoms such as a poly(ethyleneoxy) group, or a poly(propyleneoxy) group, a linear or branched unsaturated hydrocarbon group such as a propenylene group, methylpropenylene group, or butenylene group, a carbonyl group, alkylene groups containing a carbonyl group, and alkylene groups containing a carbamoyl group in the molecular chain.

Furthermore, compounds where a part or all of the hydrogen atoms in the carbon-hydrogen bonds of the compounds shown in aforementioned formulae [2] to [4] are substituted with fluorine atoms can also be used. More specifically, the compounds include a compound where a total of six hydrogen atoms in the methyl groups in bisphenol A glycidyl ether are substituted with fluorine atoms (bisphenol AF diglycidyl ether), a reaction product of an epoxy compound and a compound where a total of six hydrogen atoms in the methyl groups of bisphenol A are substituted with fluorine atoms and the like.

The components (A) can be used singly or in combination of two or more compounds.

Compound (B) that generates a base upon irradiation

The compound (B) that generates a base upon irradiation is used to cure the component (A) by generating a base upon irradiation. Note that, in the present invention, the compound (B) that generates a base upon irradiation is referred to as the component (B). The sealing material for a flat panel display of the present invention can be sufficiently cured at low temperature after irradiated with an ultraviolet or the like because of containing the component (B). Furthermore, with the sealing material for a flat panel display of the present invention that uses the component (B), the curing of the sealing material is suppressed prior to irradiation with an ultraviolet or the like, and therefore a long pot life at room temperature can be achieved. Furthermore, unlike sealing materials curable by UV cationic curing, the sealing material for a flat panel display of the present invention does not generate an acid when irradiated with an ultraviolet or the like, and therefore display members that are sealed will not be at risk of deterioration due to ionic components and acids.

The component (B) is not particularly restricted, so long as it is a compound that generates a base upon irradiation, but compounds which do not react with epoxy resin before irradiation are preferable. Specifically, quaternary ammonium salts which generate a tertiary amine upon irradiation or compounds in which the reactivity of tertiary amines is suppressed because of steric hindrance prior to irradiation and is increased as a result of removal of steric hindrance after irradiation will be preferable. The quaternary ammonium salts which generate tertiary amines are more preferable. More specifically, the salts include the compounds shown by formulae [5] to [7].

Formula 5

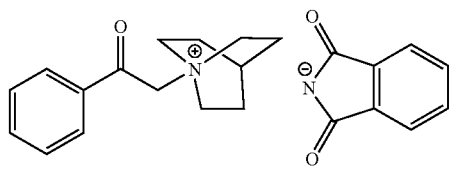

-continued

Formula 6

[6]

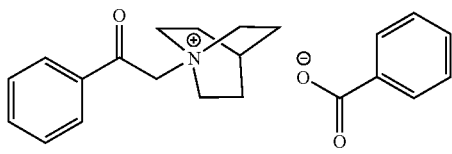

Formula 7

[7]

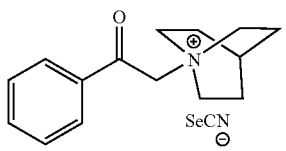

These compounds can be synthesized using a method shown in Journal of Photopolymer Science and Technology, Vol. 17, No. 1 (2004) 15-18.
Furthermore, the salts include compounds shown in the following formulae [8] and [9].

Formula 8

[8]

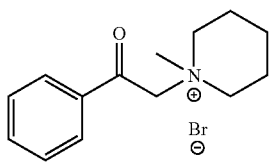

Formula 9

[9]

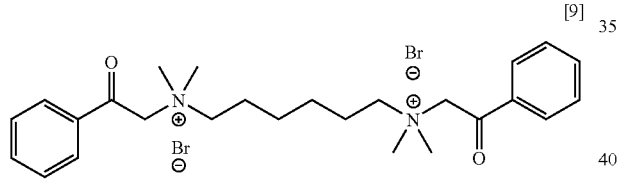

These compounds can be synthesized using a method shown in Journal of Polymer Science: Part A: Polymer Chemistry, Vol. 39, 1329-1341 (2001).
Furthermore, the salts include compounds shown in the following formulae [10] to [15].

Formula 10

[10]

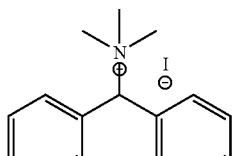

Formula 11

[11]

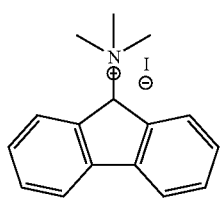

-continued

Formula 12

[12]

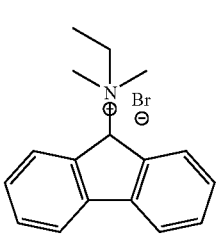

Formula 13

[13]

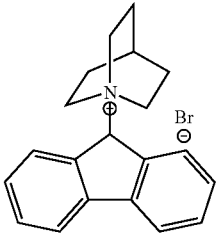

Formula 14

[14]

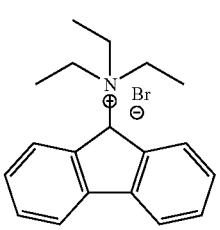

Formula 15

[15]

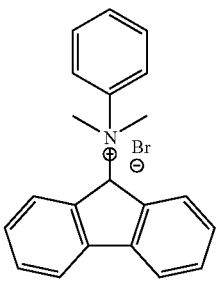

Furthermore, the salts include compounds shown in the following formulae [16] to [21].

Formula 16

[16]

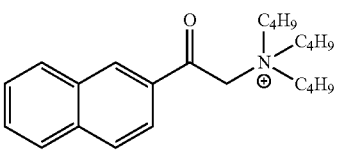

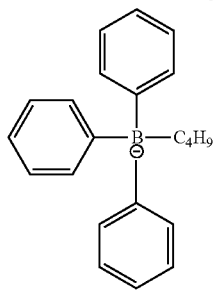

Formula 17

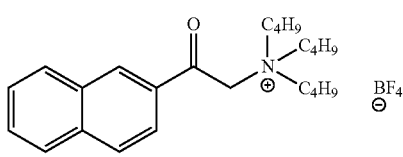

Formula 18

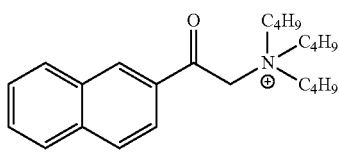

Formula 19

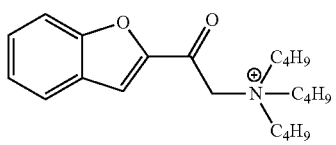

Formula 20

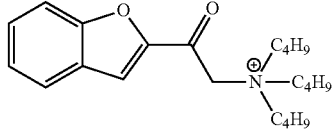

Formula 21

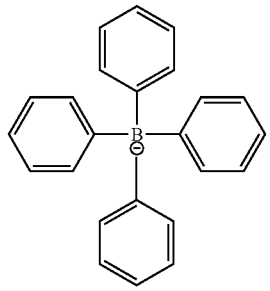

These compounds can be synthesized using a method shown in Journal of Polymer Science: Part A: Polymer Chemistry, Vol. 39, 1329-1341 (2001).

The components (B) can be used singly or in combination of two or more compounds.

Whether or not the component (B) used for the resin composition (the sealing material for a flat panel display) of the present invention generates a tertiary amine is determined by isolating the component (B) from the resin composition by column chromatography or the like, and then analyzing a solution of the component (B) by a commonly used amine analysis method such as LC-MS, capillary electrophoresis or the like before and after UV irradiation.

In the resin composition (sealing material for a flat panel display) of the present invention, the formulation content of the component (B) is determined taking into account the reactivity to the epoxy resin after the tertiary amine is generated, but is generally 0.01 to 40 parts by weight, preferably 1 to 40 parts by weight based on 100 parts by weight of the component (A), from the perspective of curability and pot life.

Acid Anhydride (C) as a Curing Agent

In the present invention, the acid anhydride (C) as a curing agent can be used with the compound (A) containing at least one epoxy group in the molecule to make an epoxy-acid anhydride curing system. Note that, in the present invention, the acid anhydride (C) as a curing agent is referred to as the component (C). In this case, the component (B) functions as a curing accelerator after tertiary amines are generated upon irradiation. Furthermore, the present invention preferably combines the component (C) with the components (A) and (B) because workability can be ensured after UV irradiation.

The acid anhydride (C) as a curing agent used in the present invention preferably can be cured at or below a temperature of 80 to 120° C., which is the heat resistance temperature of organic EL elements. The compound curable at a temperature of 120° C. or lower is more preferable, and the compound curable at a temperature of 80° C. or lower is even more preferable. Specific examples of acid anhydride as curing agents that are preferably used include phthalic anhydride, tetrahydrophthalic anhydride, hexahydrophthalic anhydride, methyltetrahydrophthalic anhydride, methylhexahydrophthalic anhydride, methylnadic anhydride, and the like.

Furthermore, the components (C) may also include polymers having at least one acid anhydride in the molecule. The method of introducing an acid anhydride into the polymer is not restricted, and for example, a method of polymerizing a vinyl monomer having an acid anhydride group or the like to make a polymer can be used. Examples of the vinyl monomers having an acid anhydride group are compounds having an acid anhydride group and a vinyl group in the molecule, such as itaconic anhydride, maleic anhydride, and 4-ethyl methacrylate trimellitic anhydride ester and the like. Furthermore, the polymers include copolymers of the vinyl monomers having an acidic anhydride group and other vinyl monomers. Examples of the other vinyl monomers are (meth) acrylates. These (meth) acrylate ester groups include straight chain or branched groups such as methyl group, ethyl group, isopropyl group, normal butyl group, isobutyl group, tertiary butyl group, 2-ethylhexyl group, cyclohexyl group, benzyl group, isoboronyl group, lauryl group, myristyl group, and the like, and the compounds have preferably a nonfunctional alkyl ester. Furthermore, the compounds which can copolymerize with the vinyl monomers that have an acid anhydride group such as styrene, α-methylstyrene, and vinylacetate and the like can be used as monomers which form the polymers with acid anhydride groups.

The polymer having an acid anhydride group can be obtained by radical polymerization of the aforementioned vinyl monomers having an acid anhydride group and the other vinyl monomers in an organic solvent using a radical polymerization initiator such as an organic peroxide compound or an azo compound. The polymer solution may be used as is, or can be used after removing the organic solvent component from the resin solution containing the polymer. Furthermore, methods of obtaining a polymer with an acid anhydride group include a method of forming an epoxy group by chemically modifying the main chain, side chains, or terminals of polymers which do not have an acidic anhydride group, and a method of polymerizing a polymer using a polymerization initiator or a chain transfer agent which has an acidic anhydride group.

The weight-average molecular weight (relative to polystyrene) of the polymer having an acidic anhydride group that is used in the present invention is not particularly specified, as long as the polymer is compatible with the other components which constitute the sealing material for an organic EL of the present invention. Preferably the weight-average molecular weight (relative to polystyrene) is 500 to 50,000.

The components (C) can be used singly or in combination of two or more compounds.

Furthermore, the formulation ratio of the acid anhydride (C) as a curing agent in the resin composition of the present invention is preferably approximately at a stoichiometric ratio based on the component (A), and is generally in a range of 0.7 to 1.5 equivalents, preferably in a range of 0.8 to 1.2 equivalents, and more preferably in a range of 0.8 to 1.0 equivalents based on 1 equivalent of the component (A).

Coupling Agent (D)

The coupling agent (D) can be added to the sealing material for a flat panel display such as a sealing material for an organic EL according to the present invention, in order to improve the interface adhesion with a base material. Note that, in the present invention, the coupling agent (D) is referred to as the component (D). Examples of the coupling agents include compounds expressed by the following formulae [22] and [23].

$$(R_2O)_3-Si-R_3R_4 \quad [22]$$

$$(R_2O)_3-Ti-R_3R_4 \quad [23]$$

In Formulae [22] and [23], $R_2$ represents an alkyl group such as a methyl group, ethyl group, or propyl group or the like. $R_3$ represents a linear or branched alkylene group of 1 to 20 carbon atoms such as methylene group, ethylene group, propylene group, or butylene group, a linear or branched poly(alkyeneoxy) group of 1 to 120 carbon atoms such as a poly(ethyleneoxy) group, or a poly(propyleneoxy) group, a linear or branched unsaturated hydrocarbon group such as a propenylene group, methylpropenylene group, or butenylene group, a carbonyl group, an alkylene group containing a carbonyl group, an alkylene group containing a carbamoyl group in the molecular chain, and a phenyl group. $R_4$ represents an alkyl group such as methyl group, ethyl group, or propyl group, glycidyl ether group, primary amine, thiol group, vinyl group, and isocyanate group. Furthermore, materials where a part or all of the hydrogen atoms in the carbon-hydrogen bonds of these coupling agents are substituted with fluorine atoms can also be used. Preferably materials where hydrogen atoms of the methylene groups and/or methyl groups are substituted with fluorine atoms are used.

The components (D) can be used singly or in combination of two or more compounds.

The formulation ratio of the coupling agent (D) in the resin composition of the present invention is generally 0 to 30 parts by weight, preferably 0.5 to 30 parts by weight, and more preferably 0.5 to 20 parts by weight based on 100 parts by weight of the aforementioned component (A).

Inorganic Fine Particle Filler (E)

The inorganic fine particle filler (E) can be added to the sealing material for a flat panel display, such as the sealing material for an organic EL, according to the present invention. Note that, in the present invention, the inorganic fine particle filler (E) is referred to as the component (E). The inorganic fine particle filler is an inorganic filler with a primary particle average diameter of 0.005 to 10 μm. Specific examples include silica, talc, alumina, mica, calcium carbonate and the like. The inorganic fine particle filler may be either a surface treated or untreated material. Examples of the surface treated inorganic fine particle fillers include inorganic fine particle fillers that have been methoxylated, trimethylsilylated, or octylsilylated, or that have been surface treated with silicone oil. The components can be used singly or in combination of two or more compounds.

The formulation content of the inorganic fine particle filler (E) in the resin composition of the present invention should be adjusted based on the transparency and the viscosity required of the sealing material, but is generally in a range of 0 to 1000 parts by weight, preferably 1 to 600 parts by weight, and more preferably 5 to 300 parts by weight, based on 100 parts by weight of the aforementioned component (A), in which case moisture impermeability, adhesion, and thixotropy are improved.

Other Additives

The resin composition of the present invention can also contain additional components such as other resins, fillers, modifiers, and stabilizers and the like, within limits not detrimental to the effects of the present invention.

Other Resin Components

Examples of the other resin components include polyamide, polyamidimide, polyurethane, polybutadiene, polychloroprene, polyether, polyester, styrene-butadiene-styrene block copolymer, petroleum resins, xylene resin, ketone resin, cellulose resin, fluorine based oligomers, silicone based oligomers, polysulfide based oligomers, and the like. The resins can be used individually or in combination of two or more kinds.

Fillers

Examples of the fillers include glass beads, styrene-based polymer particles, methacrylate-based polymer particles, ethylene-based polymer particles, propylene-based polymer particles, and the like.

The fillers can be used individually or in a combination of two or more kinds.

Modifiers

Examples of the modifiers include polymerization initiators, anti-aging agents, leveling agents, wetting agents, surfactants, plasticizers and the like. The modifiers can be used individually or in combination of two or more kinds.

Stabilizers

Examples of the stabilizers include ultraviolet absorbers, preservatives, antimicrobial agents and the like. The stabilizers can be used individually or in a combination of two or more kinds.

Manufacturing the Sealing Material for a Flat Panel Display

The sealing material for a flat panel display of the present invention, such as the sealing material for an organic EL which is suited for overall sealing, is prepared by uniformly blending the various components in the aforementioned ratios. The viscosity can be adjusted by adding other components or adjusting the resin formulation. The viscosity is preferably in a range of 100 to 10,000 mPa·s, more preferably in a range of 500 to 6000 mPa·s, from the perspective of workability suitable for overall sealing. The viscosity used herein is measured at 25° C. using an E-type viscometer (RC-500, manufactured by Toki Sangyo Co., Ltd.).

When blending the aforementioned raw materials to obtain the sealing material that is used in top emission systems, high transparency in the visible light region is required. In order to make the sealing material transparent, each of the raw materials should be selected from colorless materials. Furthermore, in the case the inorganic fine particle filler is used, the refractive index thereof is adjusted to those of the organic components such as the epoxy resin and the like, or the particle diameter of the inorganic fine particle filler is ensured to be sufficiently smaller than visible light wavelengths, so that light diffusion can be eliminated and transparency can be achieved.

Sealing Method

The sealing method for the flat panel display of the present invention comprises a step of sealing a flat panel display using the aforementioned sealing material for a flat panel display.

The method of applying the sealing material for a flat panel display of the present invention to a display substrate is not restricted so long as the sealing material can be uniformly applied. For example, a commonly known method such as applying by screen printing or using a dispenser can be performed. In an embodiment of the invention, the sealing material may be applied between the display substrate and a sealing plate with excellent humidity resistance such as a resin film, glass plate, or a metal plate.

After the sealing material is applied to the substrate, a radiation ray, specifically an ultraviolet or a visible light is applied to the sealing material, using a light source that generates an ultraviolet or a visible light, in order to convert the quaternary ammonium salt included in the sealing material to a tertiary amine. The conditions for applying the radiation ray should be appropriately selected taking into account the influence on the display substrate that is used, and the sensitivity of the quaternary ammonium salt included in the sealing material towards the radiation ray. For example, radiation ray at a UV intensity of 50 mW/cm$^2$ and UV energy of 1000 mJ/cm$^2$ can be applied using a metal halide lamp as a light source. Next, the sealing material is cured by heating. Concerning the curing conditions, curing is performed by storing the composition for 1 hour in a thermostatic chamber at 100° C.

The flat panel display of the present invention is obtained by the aforementioned sealing method.

EXAMPLES

Examples of the present invention will be described below but the present invention is not restricted to these examples.

Measurement Methods

The thus sealing material for a flat panel display obtained and the cured material thereof were evaluated as shown below.

Viscosity

The viscosity of the sealing material for a flat panel display was measured at 25° C. using an E-type viscometer (RC-500, manufactured by Toki Sangyo Co., Ltd.).

Viscosity Stability

After the sealing material for a flat panel display was allowed to stand at 25° C. for 24 hours, the viscosity was measured at 25° C. using an E-type viscometer (RC-500, manufactured by Toki Sangyo Co., Ltd.).

◯: viscosity change was less than 1.1 times; Δ: viscosity change was 1.1 to less than 1.5 times; X: viscosity change was 1.5 times or higher Curability The sealing material for a flat panel display was applied to a glass plate at a film thickness of 100 μm. The film was irradiated with UV light at 50 mW/cm$^2$ and 1000 mJ/cm$^2$ using a metal halide lamp, and stored for 1 hour in a thermostatic chamber at 80° C. Then, curability was evaluated using a finger.

◯: Cured; Δ: partially cured; X: Not cured Moisture Permeation of Film

The moisture permeation amount of the cured film (thickness of 100 μm) of the sealing material for a flat panel display was measured at conditions of 40° C. and relative humidity of 90%, in accordance with JIS Z 0208.

Adhesive Strength

The adhesive strength was determined by sandwiching the resin composition (sealing material for a flat panel display) (thickness of 20 μm) between 2 glass plates of the same kind, and then heating the unit to effect the curing and bonding. In more detail, a small amount of the sealing material was applied to the center of a glass plate 5 mm in thickness, 25 mm in length and 45 mm in width that was standardized in JIS R 3202 designated, and then UV irradiation at 50 mW/cm$^2$ and 1000 mJ/cm$^2$ was performed using a metal halide lamp. Next, a similar glass plate was overlaid so that the two glass plates formed a cross. The thickness of the sealing material was adjusted to be 20 μm using a spacer or the like. The overlaid test piece was stored in a thermostatic chamber at 80° C. for one hour to cure the composition. The tensile bond strength between the plates of the adhesion test piece manufactured from these two glass plates was measured at a tensile speed of 2 mm/minute. The adhesive strength when peeling the two substrates was measured at a tensile speed of 2 mm/minute.

Workability

The workability was evaluated based on the amount of time required for overlaying the substrates. Specifically, 0.2 cm$^3$ of the sealing material was dripped onto a glass plate and then a 40 mm×45 mm×1 mm glass plate was placed thereon. The time was measured until the sealing material formed a circle with a diameter of 40 mm.

◯: less than 30 seconds, Δ: 30 seconds to less than 60 seconds, X: 60 seconds or longer Raw Materials (A) Compound containing at least an epoxy group in the molecule (component (A));

Bisphenol F diglycidyl ether (product name EXA-830LVP, manufactured by Dainippon Ink and Chemicals Inc.)

Phenol novolac epoxy (product name YDPN638, manufactured by Tohto Kasei Co., Ltd.)

3,4-epoxycyclohexenyl methyl-3',4'-epoxy cyclohexene carboxylate (product name Celloxide 2021P, manufactured by Daicel Chemical Industries, Ltd.)

(B) Quaternary ammonium salt that generates a tertiary amine upon irradiation (component (B));

1-phenacyl-(1-azonia-4-azabicyclo[2,2,2]-octane)selenocyanate (compound shown by the formula [7]);

1-methyl-1-phenacyl-(1-azoniacyclohexane)bromide (compound shown by the formula [8]);

N,N,N-tributyl-N-acetonaphthone ammonium-triphenyl-butylborate (compound expressed by the formula [16]);

N,N,N-tributyl-N-acetobenzofuran ammonium-triphenyl-butylborate (compound expressed by the formula [19]);

(B') Tertiary amine compound (component (B'));

2,4,6-trisdimethylaminomethylphenol (product name Amicure 3010, product of Japan Epoxy Resins Co., Ltd.)

Tributylamine (product of Wako Pure Chemical Industries, Ltd.)

(C) Acidic anhydride hardening agent (Component (C));

Tetrahydromethyl phthalic anhydride (product name Epicure YH300, product of Japan Epoxy Resins Co., Ltd.)

(D) Silane Coupling Agent (Component (D));

γ-glycidoxypropyltrimethoxysilane (product name SH6040, product of Dow Corning Toray Silicone, Co., Ltd.)

(E) Inorganic fine particle filler (compound (E));

Fine particle talc (product name SG-2000, product of Nippon Talc Co., Ltd.)

Example 1

A liquid composition (sealing material for a flat panel display) was obtained by blending a compound (A) having at least one epoxy group in the molecule, and a compound (B) that generates a tertiary amine upon irradiation, according to the formulation shown in Table 1-1. The physical properties of the thus composition were evaluated.

Example 2

A liquid composition (sealing material for a flat panel display) was obtained by blending a compound (A) having at least one epoxy group in the molecule, a compound (B) that generates a tertiary amine upon irradiation, and an acid anhydride (C) as a curing agent, according to the formulation shown in Table 1-1. The physical properties of the thus composition were evaluated.

Examples 3 to 16 and Comparative Examples 1 to 4

The compositions of Table 1-1 to Table 1-3 were used similar to example 2. In other words, liquid compositions (sealing material for a flat panel display) were obtained in the same manner as in example 2, except that the components shown in Table 1-1 to Table 1-3 (the component (A) to the component (E)) were used.

TABLE 1-1

|  | Examples | | | | | | | |
|---|---|---|---|---|---|---|---|---|
|  | 1 | 2 | 3 | 4 | 5 | 6 | 7 | 8 |
| (A) Polymerizable cyclic ether compound | | | | | | | | |
| Bisphenol F diglycidyl ether | 100 | 100 | 80 | 80 | 80 | 80 | 80 | 80 |
| 3,4-epoxycyclohexenylmethyl-3',4'-epoxycyclohexene carboxylate | — | — | 20 | 20 | 20 | 20 | 20 | 20 |
| (B) Compound that generates a tertiary amin upon irradiation | | | | | | | | |
| 1-phenacyl-(1-azania-4-azabicyclo[2,2,2]-octane)selenocyanate | 5 | 5 | 5 | 5 | 0.01 | 5 | 40 | |
| 1-methyl-1-phenacyl-(1-azoniacyclohexane) bromide | | | | | | | | 0.01 |
| N,N,N-tributyl-N-acetonaphthone ammonium triphenylbutyl borate | | | | | | | | |
| N,N,N-tributyl-N-acetobenzofuran ammonium triphenylbutyl borate | | | | | | | | |
| (B') Tertiary amine compound | | | | | | | | |
| 2,4,6-trisdimethylaminomethylphenol | | | | | | | | |
| Tributylamine | | | | | | | | |
| (C) Curing agent | | | | | | | | |
| Tetrahydromethyl phthalic anhydride | — | 97 | 97 | 97 | 97 | 97 | 97 | 97 |
|  | — | (1.0) | (1.0) | (1.0) | (1.0) | (1.0) | (1.0) | (1.0) |
| (D) Coupling agent | | | | | | | | |
| γ-glycidoxypropyltrimethoxysilane | — | — | — | 4 | 4 | 4 | 4 | 4 |
| (E) Inorganic fine particle filler | | | | | | | | |
| Fine particle talc | — | — | — | — | 30 | 30 | 30 | 30 |
| Viscosity (mPa · s) | 5840 | 1850 | 1650 | 1600 | 2800 | 2910 | 3140 | 2950 |
| Curability | ○ | ○ | ○ | ○ | ○ | ○ | ○ | ○ |
| Viscosity Stability | ○ | ○ | ○ | ○ | ○ | ○ | ○ | ○ |
| Moisture Permeation (g/m$^2$ · 24 hr: 40° C. 90% RH) | 21 | 19 | 17 | 18 | 14 | 14 | 16 | 14 |
| Adhesion (MPa: glass/glass) | 19 | 16 | 15 | 19 | 21 | 23 | 25 | 23 |
| Workability | ○ | ○ | ○ | ○ | ○ | ○ | ○ | ○ |

TABLE 1-2

| | Examples | | | | | | | |
|---|---|---|---|---|---|---|---|---|
| | 9 | 10 | 11 | 12 | 13 | 14 | 15 | 16 |
| (A) Polymerizable cyclic ether compound | | | | | | | | |
| Bisphenol F diglycidyl ether | 80 | 80 | 80 | 80 | 80 | 80 | 80 | 80 |
| 3,4-epoxycyclohexenylmethyl-3',4'-epoxycyclohexene carboxylate | 20 | 20 | 20 | 20 | 20 | 20 | 20 | 20 |
| (B) Compound that generates a tertiary amin upon irradiation | | | | | | | | |
| 1-phenacyl-(1-azania-4-azabicyclo[2,2,2]-octane)selenocyanate | 5 | | | | | | | |
| 1-methyl-1-phenacyl-(1-azoniacyclohexane) bromide | | 40 | | | | | | |
| N,N,N-tributyl-N-acetonaphthone ammonium triphenylbutyl borate | | | 0.01 | 5 | 40 | | | |
| N,N,N-tributyl-N-acetobenzofuran ammonium triphenylbutyl borate | | | | | | 0.01 | 5 | 40 |
| (B') Tertiary amine compound | | | | | | | | |
| 2,4,6-trisdimethylaminomethylphenol | | | | | | | | |
| Tributylamine | | | | | | | | |
| (C) Curing agent | | | | | | | | |
| Tetrahdromethyl phthalic anhydride | 97 (1.0) | 97 (1.0) | 97 (1.0) | 97 (1.0) | 97 (1.0) | 97 (1.0) | 97 (1.0) | 97 (1.0) |
| (D) Coupling agent | | | | | | | | |
| γ-glycidoxypropyltrimethoxysilane | 4 | 4 | 4 | 4 | 4 | 4 | 4 | 4 |
| (E) Inorganic fine particle filler | | | | | | | | |
| Fine particle talc | 30 | 30 | 30 | 30 | 30 | 30 | 30 | 30 |
| Viscosity (mPa · s) | 3010 | 3680 | 2780 | 3240 | 3570 | 2980 | 3360 | 3580 |
| Curability | ○ | ○ | ○ | ○ | ○ | ○ | ○ | ○ |
| Viscosity Stability | ○ | ○ | ○ | ○ | ○ | ○ | ○ | ○ |
| Moisture Permeation (g/m$^2$ · 24 hr: 40° C. 90% RH) | 15 | 18 | 13 | 13 | 14 | 13 | 14 | 14 |
| Adhesion (MPa: glass/glass) | 24 | 24 | 19 | 21 | 25 | 20 | 20 | 24 |
| Workability | ○ | ○ | ○ | ○ | ○ | ○ | ○ | ○ |

TABLE 1-3

| | Comparative Examples | | | |
|---|---|---|---|---|
| | 1 | 2 | 3 | 4 |
| (A) Polymerizable cyclic ether compound | | | | |
| Bisphenol F diglycidyl ether | 80 | 80 | 80 | 80 |
| 3,4-epoxycyclohexenylmethyl-3',4'-epoxycyclohexene carboxylate | 20 | 20 | 20 | 20 |
| (B) Compound that generates a tertiary amin upon irradiation | | | | |
| 1-phenacyl-(1-azania-4-azabicyclo[2,2,2]-octane)selenocyanate | | | | |
| 1-methyl-1-phenacyl-(1-azoniacyclohexane) bromide | | | | |
| N,N,N-tributyl-N-acetonaphthone ammonium triphenylbutyl borate | | | | |
| N,N,N-tributyl-N-acetobenzofuran ammonium triphenylbutyl borate | | | | |
| (B') Tertiary amine compound | | | | |
| 2,4,6-trisdimethylaminomethylphenol | 0.01 | 5 | | |
| Tributylamine | | | 0.01 | 5 |
| (C) Curing agent | | | | |
| Tetrahdromethyl phthalic anhydride | 97 (1.0) | 97 (1.0) | 97 (1.0) | 97 (1.0) |
| (D) Coupling agent | | | | |
| γ-glycidoxypropyltrimethoxysilane | 4 | 4 | 4 | 4 |
| (E) Inorganic fine particle filler | | | | |
| Fine particle talc | — | — | — | — |
| Viscosity (mPa · s) | 1624 | 1750 | 1750 | 1800 |
| Curability | X | ○ | X | ○ |
| Viscosity Stability | ○ | X | ○ | X |
| Moisture Permeation (g/m$^2$ · 24 hr: 40° C. 90% RH) | — | 17 | — | 20 |
| Adhesion (MPa: glass/glass) | — | 25 | — | 25 |
| Workability | ○ | ○ | ○ | ○ |

Note that, the units of the values for the components in Table 1-1 to Table 1-3 are parts by weight. However, the values in parentheses in the column for the component (C) express the amount (equivalent) of the component (C) based on 1 equivalent of the component (A).

The invention claimed is:

1. A sealing material for a flat panel display comprising: 100 parts by weight of a compound (A) containing at least one epoxy group in the molecule; and 0.01 to 40 parts by weight of a compound (B) that generates a base upon irradiation, wherein the compound (B) is selected from the group consisting of compounds represented by the following formulae (5) to (21):

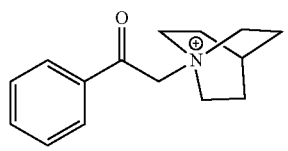  [5]

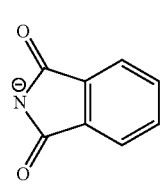

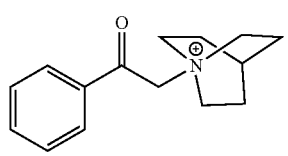  [6]

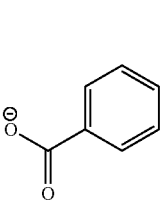

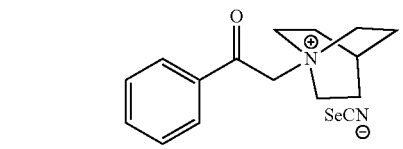  [7]

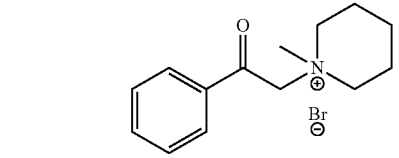  [8]

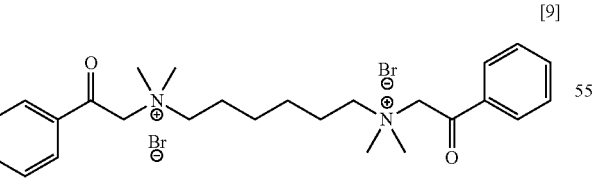  [9]

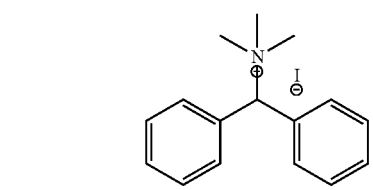  [10]

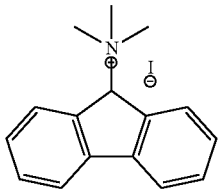  [11]

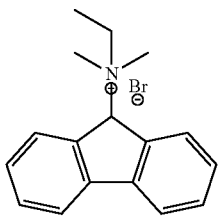  [12]

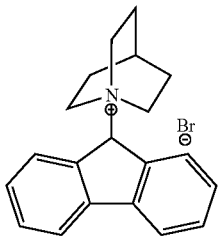  [13]

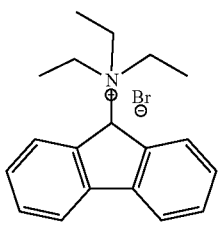  [14]

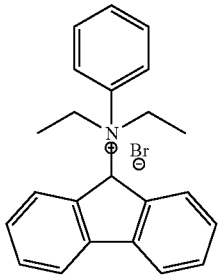  [15]

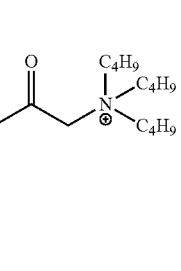  [16]

-continued

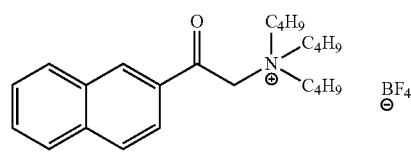
[17]

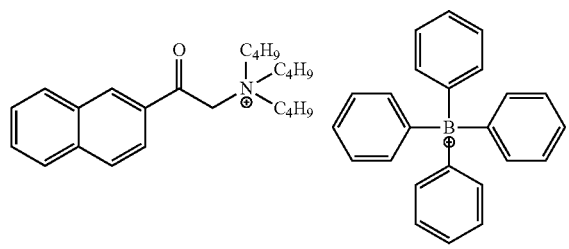
[18]

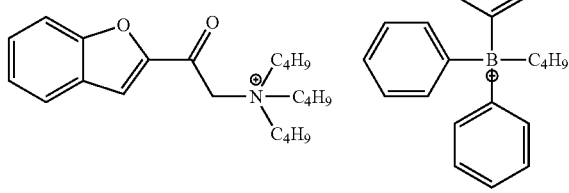
[19]

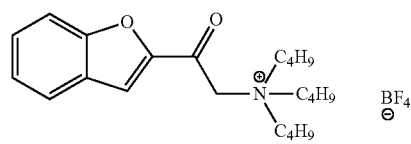
[20]

-continued

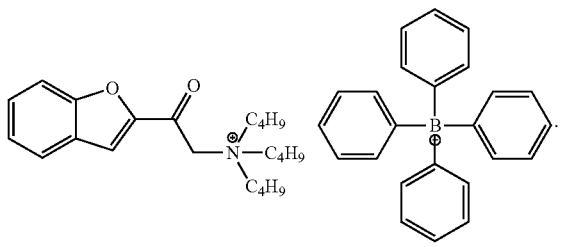
[21]

2. The sealing material for a flat panel display according to claim 1, further comprising 0.8 to 1.2 equivalents of an acid anhydride (C) as a curing agent based on 1 equivalent of the compound (A) containing at least one epoxy group in the molecule.

3. The sealing material for a flat panel display according to claim 2, wherein the acid anhydride (C) is at least one acid anhydride selected from the group consisting of phthalic anhydride, tetrahydrophthalic anhydride, hexahydrophthalic anhydride, methyltetrahydrophthalic anhydride, methylhexahydrophthalic anhydride and methylnadic anhydride.

4. The sealing material for a flat panel display according to claim 1, further comprising 0 to 30 parts by weight of a silane coupling agent (D) based on 100 parts by weight of the compound.

5. The sealing material for a flat panel display according to claim 1, further comprising 0 to 1000 parts by weight of an inorganic fine particle filler based on 100 parts by weight of the compound (A).

6. A sealing method for a flat panel display, comprising a step of sealing a flat panel display using the sealing material for a flat panel display as claimed in claim 1.

7. A flat panel display obtained by the sealing method as claimed in claim 6.

8. A sealing method for a flat panel display, comprising a step of sealing a flat panel display using the sealing material for a flat panel display as claimed in claim 3.

9. A flat panel display obtained by the sealing method as claimed in claim 8.

* * * * *